United States Patent [19]

Ruby

[11] Patent Number: 5,191,236
[45] Date of Patent: Mar. 2, 1993

[54] SYSTEM AND CIRCUITS USING JOSEPHSON JUNCTIONS

[75] Inventor: Richard C. Ruby, Menlo Park, Calif.

[73] Assignee: Hewlett-Packard Company, Palo Alto, Calif.

[21] Appl. No.: 554,228

[22] Filed: Jul. 16, 1990

[51] Int. Cl.$^5$ .................... H03K 3/38; H03B 15/00
[52] U.S. Cl. ................................ 307/306; 307/277;
331/107 S; 505/854; 505/861
[58] Field of Search ........................ 307/277, 306;
331/107 S; 505/859, 853, 861

[56] References Cited

U.S. PATENT DOCUMENTS

| | | | |
|---|---|---|---|
| 3,573,662 | 4/1971 | Fulton | 307/277 |
| 3,725,819 | 4/1973 | Fulton | 331/107 S |
| 4,168,441 | 9/1979 | McDonald et al. | 307/277 |
| 4,344,052 | 8/1982 | Davidson | 307/306 |
| 4,468,635 | 8/1984 | Lukens et al. | 331/107 S |
| 4,983,971 | 1/1991 | Przybysz et al. | 307/277 |

OTHER PUBLICATIONS

M. Klein, "Josephson Junction Clock Oscillator" IBM Tech. Discl. Bulletin vol. 16, No. 7, Dec. 1973, pp. 2403-2404.
"An On-Chip Superconducting Clock with Two Modes," Lee, Silver and Sandell, IEEE Trans. Magn., vol. 25, No. 2, pp. 834-836 (Mar. 1989).
"A Josephson Analog Limiter Circuit," Petersen, Hebert and Van Duzer, IEEE Trans. Magn., vol. 25, No. 2, pp. 818-821 (Mar. 1989).
"Dynamic Behavior of a Josephson Latching Comparator for Use in a High-Speed Analog-to-Digital Converter", Petersen et al., IEEE Trans. Magn., vol. MAG23, No. 2, pp. 891-894 (Mar. 1987).
"Analog-to-Digital Conversion with Unlatched SQUID's," Hurell, Pridmere-Brown and Silver, IEEE Trans. Electron Devices, vol. ED-27, No. 10, pp. 1887-1896 (Oct. 1980).
"A DC-Powered Josephson Flip-Flop," Hebard, Pei, Dunkleberger and Fulton, IEEE Trans. Magn., vol. MAG-15, No. 1, pp. 408-411 (Jan. 1979).
MECL System Design Handbook, W. Blood, Motorola, Inc. (1983), pp. 48-59.

Primary Examiner—John Zazworsky

[57] ABSTRACT

An electronic clock has a single Josephson junction connected in parallel to a resonant circuit, which is a delay line with a matching resistance at the input end to provide series termination. The opposite end of the delay line is an open end to reflect pulses, and the pulse transit time on the line determines the clock rate. A zero crossing detector is provided to initiate the clock operation when an input signal rises above a given threshold, and a reset circuit is included to turn off the clock when the input signal falls below this threshold. A flip-flop circuit allows the clock to be turned on by alternate initiating signal pulses. A modification includes a pulse rejuvenating circuit at the end of the delay line to offset pulse degradation. All of the circuits are fabricated with Josephson junction elements, and the zero crossing detector, reset circuit, flip-flop circuit and pulse rejuvenator circuits include dc-SQUID's. The clock is capable of operation at frequencies up to 100 GHz and can sample input single frequencies as high as 15 GHz.

10 Claims, 10 Drawing Sheets

SYSTEM AND CIRCUITS USING JOSEPHSON JUNCTIONS

BACKGROUND OF THE INVENTION

This invention is concerned with the field of electronic circuits, timing devices and clocks, and more particularly, it is related to the field of such devices having superconducting or Josephson junctions as circuit elements.

The use of Josephson junctions as electronic circuit elements only became possible after 1962 when the Josephson effect was discovered. At that time the only known superconducting materials had such low critical temperatures (i.e., temperatures below which the material becomes superconducting) that any circuit using Josephson junction elements required a source of liquid helium to maintain the low temperature required. Since that time the improvements in low-temperature technology, and also the discovery of high $T_c$ superconducting materials, have made these limitations less serious and increased the potential practical importance of electronic circuits designed with Josephson junction elements.

Josephson junctions are highly nonlinear and unusual circuit elements, and can be used to design circuits having many interesting and improved properties. The primary advantages of these junctions are their low power requirements and high operating speeds compared with conventional, nonlinear circuit elements. For the convenience of the reader, we briefly summarize some of the features and characteristics of Josephson junctions that were known to persons skilled in the relevant art prior to the present invention.

A Josephson junction is a junction between two superconducting materials that are closely spaced, forming electrodes in weak electrical contact. These junctions may be of several types, e.g., tunnel junctions, weak links, point contacts, bridges, etc. The essential requirement is that the superconductors on either side of the junction are coupled to each other.

The description of the electrical properties of the superconductors on each side of the junction is best cast in terms of the order parameters for these two materials, $\psi_1, \psi_2$. This quantity, first introduced in the phenomenological theory of Ginzburg and Landau [V. L. Ginzburg and L. D. Landau, Zh. Eksp. Teor. Fiz. (Soviet Physics—JETP, Vol. 20, p. 1064 (1950)] is a complex-valued function of time and position in a superconducting material, and it satisfies a Schrodinger-like differential equation. It may be regarded as the average wave function for the carriers of supercurrent. (In the microscopic theory of Bardeen, Cooper and Schrieffer [J. Bardeen, L. N. Cooper and J. R. Schrieffer, Phys. Rev. Vol. 108, p. 1175 (1957)], the order parameter is the average wave function of the so-called "Cooper pairs" which carry the electrical current.) Since $\Psi$ is complex-valued, it may be written as:

$$\psi(\vec{r}, t) = |\psi(\vec{r}, t)| e^{j\chi(r,t)}. \qquad (1)$$

The square of the absolute value, $|\psi|^2$ is the density of supercurrent carriers as a function of position and time. The phase of the order parameter, $\chi(\vec{r},t)$, is related to the flow of current within the material.

The superconducting materials on either side of the junction each have their characteristic order parameters and phases, $\chi_1$ and $\chi_2$. The electrical description of the junction itself is best described in terms of the difference between these two phases:

$$\phi = \chi_1 - \chi_2, \qquad (2)$$

where $\chi_1$ and $\chi_2$ are evaluated at the interface between the superconducting material and the junction. The quantity $\phi$, called the "Josephson phase," or simply phase of the junction, is a function of time which determines the supercurrent flow through the junction and the voltage across the junction. These quantities are related by the two Josephson equations:

$$I_s = I_c \sin\phi, \qquad (3)$$

$$\dot\phi = d\phi/dt = 2e/\bar{n} \times V, \qquad (4)$$

where $I_s$ is the junction supercurrent, V is the voltage difference across the junction, e is the electronic charge and $\bar{n}$ is Planck's constant divided by $2\pi$. The quantity $I_c$ is called the critical current and represents the maximum value of the supercurrent $I_s$. The critical current depends on the structure of the Josephson junction, and other variables. For simplicity, we will ignore these latter effects in the following discussion.

Equations 3 and 4 define the Josephson effect. Equation 3 shows that the junction supercurrent is a periodic function of the phase $\phi$ with period $2\pi$, and can take any value from 0 to $I_c$. At a given value of $\phi$, constant in time, since $\dot\phi=0$, Equation 4 indicates that $V=0$ so that this steady supercurrent flows with no voltage drop across the junction. This is known as the "dc Josephson effect."

If a dc voltage V is applied across the junction, Equation 4 shows that an alternating current will be produced in the junction, given by:

$$I_s = I_c \sin(\phi_0 + 2e/\bar{n} \times Vt), \qquad (5)$$

where $\phi_0$ is a constant of integration. The frequency of this alternating current is given by:

$$f = 2e/h \times V. \qquad (6)$$

This alternating current is called the "ac Josephson effect." The ratio between the oscillation frequency and applied voltage is 483.6 MHz/$\mu$V.

In addition to the supercurrent flow through the junction, there can be other currents flowing by ordinary mechanisms. These must be considered in describing completely the electrical behavior of Josephson junction in circuits. At any finite temperature, there is always some normal current flow, given by $I_N$, for any nonvanishing voltage V. These quantities are not necessarily proportional. However, when the temperature is only slightly below the critical temperature, or when the voltage is sufficiently high, we can write:

$$V = R_N I_N, \qquad (7)$$

where $R_N$ is the normal resistance of the junction, and its reciprocal, $G_N$, is the normal junction conductance.

Furthermore, for any given capacitance of the junction C, there is a flow of displacement current through the junction when the voltage varies with time, given by:

$$I_D = C\dot{V} = C \times dV/dt. \qquad (8)$$

Although the displacement current does not constitute any actual flow of electrical charges through the junction, it must be taken into consideration in describing the junction electrically. Therefore, the total current is given by:

$$I = I_S + I_N + I_D. \qquad (9)$$

(We are neglecting complications in this simple description, such as thermal and noise fluctuations of the current.) This simple description, known as the resistively shunted junction (RSJ) model, is illustrated in FIG. 2. The curved line through the resistor symbol indicates the fact that the normal conductance is generally not constant but depends on the voltage V.

From the foregoing considerations, it is clear that a Josephson junction cannot be simply described in a circuit by a graph of voltage versus current, unlike most other nonlinear circuit elements. Clearly, a dc input signal can generate a time-dependent response in the junction. Nevertheless, we can use the RSJ model to construct an I-V curve that approximately describes the salient features of Josephson junctions and is sufficient for purposes of understanding the present invention. The character of this curve will depend on the parameters of the junction, and in particular, on the amount of damping. The damping of the junction is described by the parameter $\beta$:

$$\beta = 2e/\hbar \times I_C R_N^2 C. \qquad (10)$$

Junctions with $\beta << 1$ are said to have high damping, and $\beta >> 1$ corresponds to low damping.

We can use the RSJ model to construct an I-V curve for the total junction current as a function of the time-averaged voltage. Such a curve is shown in FIG. 3 for the case of high damping (curve a) and low damping (curve b), assuming a constant normal conductance. Curve c is a more realistic representation that takes into account the variation of conductance with voltage.

This curve has a break or "knee" at approximately $V_g$, the "gap voltage." This reflects the fact that when the average voltage across the junction exceeds the voltage required to break apart a Cooper pair and permit conduction by ordinary electron mechanisms, the effective conductance substantially increases.

From FIG. 3, it is apparent that if a current source drives a small current through the junction, no voltage difference will be developed across the junction. This condition remains true as the current is gradually increased, as shown by the arrow, until the current reaches its maximum value, $I_c$. In this I-V regime, the junction is said to be in the "S-state," or stationary state.

When the current is driven over the limiting $I_c$ value it can no longer be carried solely by the supercurrent carriers, and a voltage develops across the junction. The condition of the junction then switches over to the appropriate curve on the plot of FIG. 3 as shown by the dashed line with arrows. The junction voltage shown in this plot is the time-averaged value; the actual voltage has an additional alternating component which varies with the average voltage itself. As the current gradually increases the I-V curves in FIG. 3 approach the straight-line plot of an ohmic junction. In the nonvanishing-voltage portion of the I-V curve, the junction is said to be in the "R-state," or resistance state.

As the current is again decreased gradually, the average voltage follows the curve back to the ordinate as shown by the arrow in FIG. 3. This voltage vanishes when the current is decreased to the "return current" value, $I_R$. Below this value the junction switches back to the S-state (provided that the amplitudes of oscillations in the voltage are not too large). It is clear from the figure that when the junction damping is small, $I_R$ can be very small compared to $I_c$. Under these conditions, the S-R transition exhibits a large hysteresis. For a highly damped junction the hysteresis is negligible.

Furthermore, although the RSJ model as discussed here describes the electrical properties of the junction itself, clearly from FIG. 2 we can adjust the model parameters by connecting a capacitance or resistance in shunt with the junction and using the model to describe the overall circuit as an "effective junction." Therefore, one can connect a resistance in shunt with a Josephson junction to produce an effective junction that is highly damped. Similarly, one could connect a capacitance in shunt with the junction to lower the damping.

FIG. 4 shows schematically the oscillations in the actual junction voltage as the above cycle is carried out. The upper graph is a plot of the driving current as a function of time. The lower graph shows the corresponding voltage across the junction. Initially, the junction is in the S-state, and at $t=0$, the current increases through the critical value $I_c$ and then remains constant at a value slightly greater than $I_c$. This causes the junction to switch to the R-state, and the voltage rises to a value on the R-branch of the I-V curve. The fluctuations in the voltage during this increase are indicated on the graph. It is assumed that the junction is not heavily damped so that these acfluctuations are not negligible. Assuming also that the average voltage as a function of current is described by curve (c) of FIG. 3, the voltage rises to a value approximately $V_g$.

At time $t'$ the driving current decreases to 0, returning the junction to the S-state. The average voltage then decreases as shown in the lower graph of FIG. 4. The actual voltage decays with a series of "plasma oscillations." These oscillations are at the natural frequency of the junction, called the plasma frequency, arising from the coupling of the junction capacitance and the effective inductance reflected by the Josephson equations (3), (4), which state that a time-dependent current gives rise to a junction voltage. However, these oscillations are not generally sinusoidal, and indeed they are markedly nonsinusoidal as the mean voltage approaches 0. At higher mean voltages, on the other hand, the voltage oscillations are nearly sinusoidal.

The foregoing description shows that Josephson junctions may be used as switches in logic circuits, and indeed they are useful as logic gates in comparison with corresponding semiconductor elements. Silicon and gallium arsenide logic gates generally require at least two orders of magnitude more switching energy than Josephson logic gates, and switching times can be made at least an order of magnitude faster by using Josephson junction technology. The delay times on the voltage graph in FIG. 4 can be of the order of several picoseconds. The high speed and low power requirements of Josephson logic elements make them attractive candidates for use in computer circuits and information processing devices.

An example of a useful Josephson logic circuit is the two-junction interferometer, which is a circuit having two Josephson junctions in a superconducting loop. This circuit is a dc type of superconducting quantum interference device (SQUID). FIG. 5 is a schematic diagram of such a circuit. Two Josephson junctions, labeled "1" and "2," are placed in a closed circuit of otherwise superconducting material. A nearby conductor carries a control current $I_{con}$, which generates an externally controlled magnetic flux $\Phi_{ex}$ threading the interior of the superconducting circuit. The two junctions are driven by a gate current $I_g$ that is fed to the circuit between the junctions, as shown in the figure. For simplicity, we assume that the two junctions are identical, with phases $\phi_1$ and $\phi_2$, and that the circuit is symmetrical with respect to the two branches. We also assume that the junctions are highly damped and their critical currents are equal, $I_c$.

If the superconducting circuit were unbroken, the total magnetic flux $\Phi$ through the interior of the loop would be quantized in units of the basic quantum of flux:

$$\Phi_o = h/2e = 2.07 \times 10^{-15} \text{ Webers.} \tag{11}$$

Because the loop is interrupted by the junctions, the total flux in the loop can deviate from integer multiples of this value. (We assume that the flux in the junctions themselves is small compared to $\Phi_o$.) When one of these junctions switches to the R-state, the superconducting loop is broken, and one or more flux quanta may enter or leave the loop. Therefore, there are a multiplicity of stable states of the circuit where both junctions are in the S-state. These states are characterized by the number of flux quanta in the loop. This plurality of stable states enables this circuit to function as a digital logic device.

If the control current and total magnetic flux through the loop are initially 0, the gate current $I_g$ is split equally between the two junctions. These junctions will remain in the S-state as $I_g$ increases up to a maximum value, $I_{gc}$, which in this case is $2I_c$. Since $I_1$ and $I_2$ are equal, the total magnetic flux through the loop produced by these currents is 0.

Now we assume that the number of quanta in the loop is 0 and the junctions are in their S-states, but that the control current $I_{con}$ is given a finite value, flowing to the right in FIG. 5. This control current will cause a magnetic flux $\Phi_{ex}$ to thread the loop. In order to try to maintain the number of quanta in the loop equal to 0, a compensating current $I_{circ}$ is induced in the loop in the counterclockwise direction. Therefore, $I_1$ is greater than $I_2$. Choosing sign conventions according to the arrow directions in FIG. 5, $$I_{circ} = \frac{1}{2} \times (I_1 - I_2). \tag{12}$$

The gate current may be increased from 0 up to its maximum value at which $I_1$ reaches the critical current:

$$I_{gc} = 2(I_c - I_{circ}). \tag{13}$$

Thus, the maximum value of the gate current is decreased by turning on the control current.

Quantitatively, the two-junction interferometer is described by the basic equation:

$$\phi_1 - \phi_2 = 2\pi \times \Phi/\Phi_0, \tag{14}$$

which relates the junction phases to the total flux through the loop. This total flux is given by:

$$\Phi = \Phi_{ex} - LI_{circ}, \tag{15}$$

where L is the self-inductance of the loop. When the junctions are in the S-state, $$I_1 = I_c \sin \phi_1, \tag{16}$$

$$I_2 = I_c \sin \phi_2. \tag{17}$$

These equations can be solved to determine the maximum gate current $I_g$ and total flux $\Phi$ as functions of $I_1$ (or $I_2$) and $\Phi_{ex}$ (or $I_{con}$). As discussed above, these solutions have a plurality of branches, each branch corresponding to the integer multiple of $\Phi_0$ closest to $\Phi$. FIG. 6 comprises graphs of the maximum value of $I_g$ for both junctions to remain in the S-state, and the corresponding values of $I_1$ and $I_2$, as functions of the externally imposed flux through the loop, $\Phi_{ex}$. The solutions are labeled by the branch number n, which is the approximate number of flux quanta through the loop in the branch, i.e., $n=0$ corresponds to 0 total flux, $n=1$ corresponds to a total flux $\Phi_0$, etc. This is shown in FIG. 7, which is a plot of total flux through the superconducting loop as a function of the externally applied magnetic flux generated by the control current $I_{con}$.

FIG. 6 shows that there are ranges of values of $\Phi_{ex}$ for which the superconducting loops have two stable states in which both junctions are in S-states, namely the regions where $\Phi_{ex}$ is nearly an odd multiple of $\frac{1}{2}\Phi_0$. FIG. 8 is a plot of the maximum gate current $I_{gc}$ as a function of $\Phi_{ex}$ for values of $\Phi_{ex}$ near $\frac{1}{2}\Phi_0$; i.e., FIG. 8 is an enlarged plot of the corresponding portion of the $I_{gc}$ graph in FIG. 6. Referring to this graph, for value of $\Phi_{ex}$ between $\Phi_-$ and $\Phi_+$, there are two stable states of the circuit, one corresponding to $n=0$ and the other corresponding to $n=1$. Since the maximum magnetic flux through the loop in this range is approximately $\Phi_0$, this is called the "single flux quantum" (SFQ) regime.

From FIG. 8 it is clear that in order to switch the circuit from the $n=0$ to $n=1$ region and remain in the S-state for both junctions, the gate current must not be too high. In fact, the gate current must be less than $I_M$ (FIG. 8). For example, point A has a gate current $I_A > I_M$. As the control current is increased, the loop will be driven into a R-state; a voltage will develop across both junctions.

Point B falls below the limiting gate current for both branches. Nevertheless, if the junctions are not sufficiently damped, increasing $\Phi_{ex}$ will drive the junctions into the R-state because of the ac fluctuations as the junction current reaches the critical value $I_c$. In order to remain in the S-state the gate current must fall below some value $I_Q$ which depends on the damping parameter $\beta$. For example, point C will be driven from the $n=0$ S-state to the $n=1$ S-state as the external flux $\Phi_{ex}$ increases past the value $\Phi_1$. Note also that in order to return to the $n=0$ condition at this gate current, the external flux $\Phi_{ex}$ must decrease to the value $\Phi_2$. Thus this circuit exhibits a kind of hysteresis in switching between the 0 and single quantum flux states. This should be distinguished from the hysteresis of underdamped junctions discussed previously.

Finally, we note that two-junction interferometers may be driven by current pulses as well as magnetic fluxes. If a gate current pulse is applied to the circuit at point D, the loop will again be driven from the $n=0$ to the $n=1$ condition, in the S-state.

The above description of a two-junction interferometer illustrates how it can be operated as a memory cell, and in particular, how a write operation would be carried out. A read operation would employ a similar process. This particular mode of operation would result in a destructive readout, but Josephson junction circuits have been designed for memory cells with nondestructive readout.

A variety of other logic circuits have been designed using Josephson junctions. An article by J. P. Hurrell, D. C. Pridmore-Brown and A. H. Silver, "Analog-to-Digital Conversion with Unlatched SQUID's," *IEEE Transactions on Electron Devices.* Vol. ED-27, No. 10, October 1980, pp. 1887–1896, discloses a high-speed A/D converter using bistable two-junction SQUID's. A Josephson junction flip-flop circuit is described in the paper by A. F. Hebard, S. S. Pei, L. N. Dunkleberger and T. A. Fulton, "A DC-Powered Josephson Flip-Flop," *IEEE Transactions on Magnetics,* Vol. MAG-15, No. 1, January 1979, pp. 408–411. D. A. Peterson, H. Ko and J. Van Duzer discuss a latching comparator in their paper "Dynamic Behavior of a Josephson Latching Comparator for use in a High-Speed Analog-to-Digital Converter," *IEEE Transactions on Magnetics,* Vol. MAG-23, No. 2, March 1987, pp. 891–894. A clipping circuit using a Josephson junction is disclosed in the paper by D. A. Peterson, D. Hebert and T. Van Duzer, "A Josephson Analog Limiter Circuit," *IEEE Transactions on Magnetics.* Vol. 25, No. 2, March 1989, pp. 818–821.

Finally, a two-junction SQUID flip-flop with transmission lines has been used to construct a clock, described in the paper by G. S. Lee, A. H. Silver and R. D. Sandell, "An On-Chip Superconducting Clock with Two Modes," *IEEE Transactions on Magnetics,* Vol. 25, No. 2, March 1989, pp. 834–836. The SQUID described in this paper operates at a frequency that depends on the total magnetic flux threading the SQUID. Therefore, the clock is sensitive to any accidental trapping of magnetic flux that may occur.

SUMMARY OF THE INVENTION

The present invention is an electronic clock that employs superconducting circuit elements, specifically Josephson junctions, and that has a clock pulse generating circuit that is comprised of a single Josephson junction connected in parallel with a resonant circuit, specifically an open-ended delay line. The Josephson junction is highly damped and biased near its critical current. The delay line is connected in series to a resistor at the input end to provide impedance matching at the input of the line. This resistor also prevents "ringing" of the delay line and spurious signals. A counter is connected to the junction to record pulses generated by the clock circuit.

An initial current pulse at the Josephson junction causes it to generate a voltage pulse that travels down the transmission line and is reflected back to the input. During this transit the Josephson junction returns to its initial state. The arrival of the return pulse causes the junction to generate another voltage pulse, and the cycle is repeated. The time between pulses is therefore determined by the delay line transit time.

The initiating pulse is provided by a zero crossing detector (ZCD) that is comprised of a two-junction dc SQUID, magnetically driven by signals from a clipper circuit. The ZCD produces a pulse when the input signal voltage rises above a given threshold, nominally 0. The clipper circuit comprises a Josephson junction connected in parallel to the magnetic driver circuit of the ZCD SQUID, which comprises the driving inductor in series with a resistance. The Josephson junctions in the SQUID of the circuit are highly damped. The ZCD pulses are fed into a flip-flop circuit, again comprising a highly damped two-junction SQUID, that selects every other pulse and produces a corresponding pulse that drives the clock circuit described above.

The alternate pulses from this flip-flop circuit are transmitted to a reset circuit that is connected in series in the dc bias current supply line for the clock Josephson junction. The reset circuit comprises a magnetically controlled SQUID connected in parallel to a resistor and inductance in series. The reset pulses cause the SQUID to interrupt the bias current to the clock and turn it off. The L/R time constant determines the period over which the clock circuit is gradually returned to its initial condition.

A modification of this circuit includes a pulse rejuvenator at the end of the transmission line, instead of merely an open-ended line. This pulse rejuvenator offsets the effects of pulse degradation in the line, and it comprises a Josephson junction and series matching resistance connected to the end of the line in the same manner as the clock junction and resistance are connected at the beginning of the line. The junction is also connected to an arming circuit, which controls the rejuvenator junction in the same manner as the reset circuit controls the clock junction. The pulse rejuvenator receives the pulse sent down the line by the clock junction and sends back a corresponding return pulse. A counter may also be connected to the rejuvenator junction.

It is an object of the invention to provide an electronic clock circuit having a single Josephson junction connected in parallel to a resonant circuit.

A second object is to provide such an electronic clock, wherein the resonant circuit has a transmission line connected in series with an impedance-matching resistor.

Another object of this invention is to provide an electronic clock having a zero crossing detector circuit, which turns on the clock when an input signal reaches a given threshold.

A further object of this invention is to provide an electronic clock having a reset circuit which turns off the clock and resets it when an input signal reaches a given threshold.

Still another object of this invention is to provide an electronic clock having means for rejuvenating the pulses generated by the clock.

These and other objects, advantages, characteristics and features of this invention may be better understood by examining the following drawings together with the detailed description of the preferred embodiment.

DETAILED DESCRIPTION OF THE INVENTION

Figure 1:
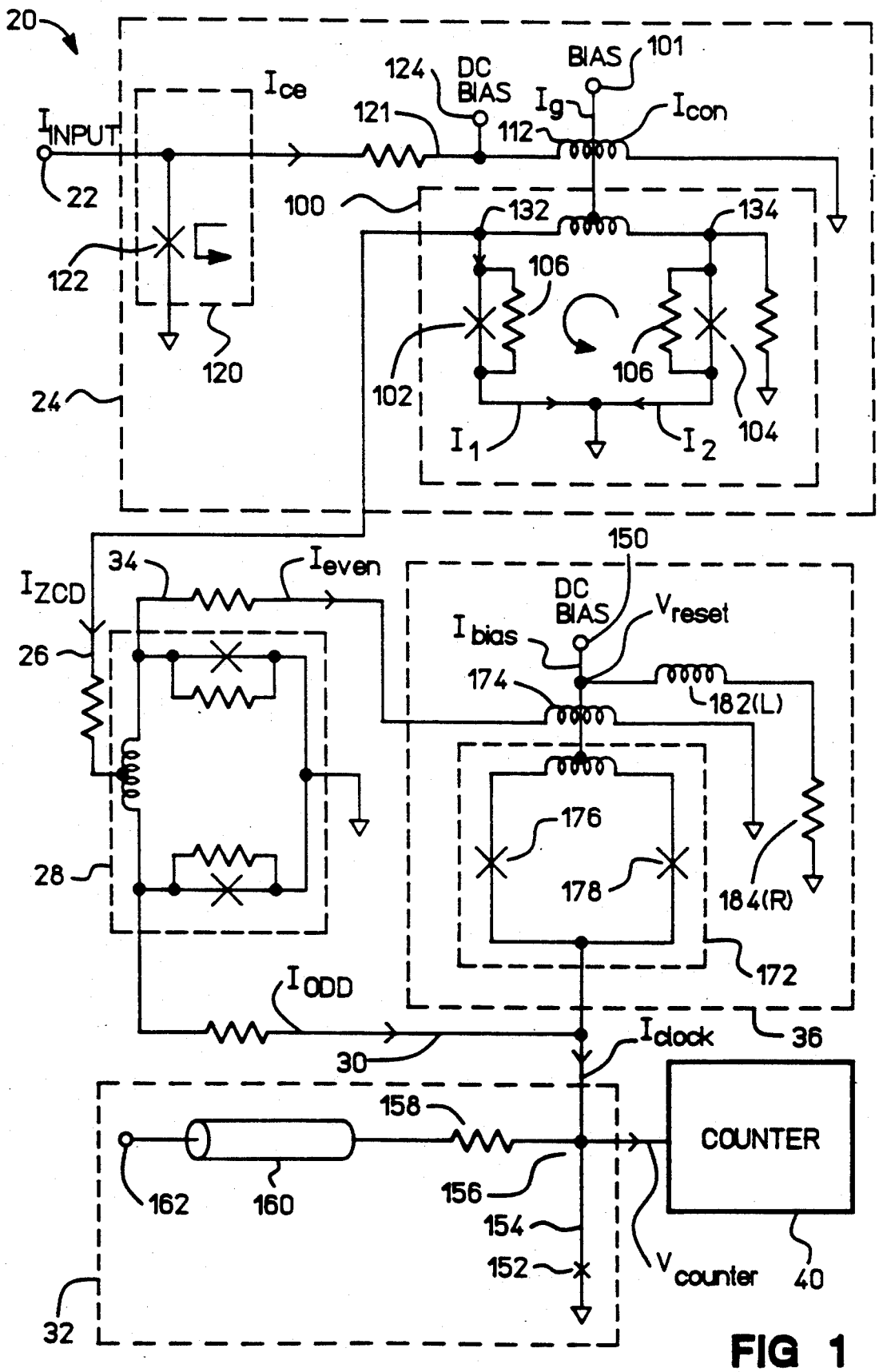
FIG. 1 is a schematic circuit diagram of the system and circuits of this invention, including a clock circuit, a zero crossing detector circuit, reset circuit and flip-flop circuit. Each Josephson junction is indicated by the circuit symbol "X".
Figure 10:
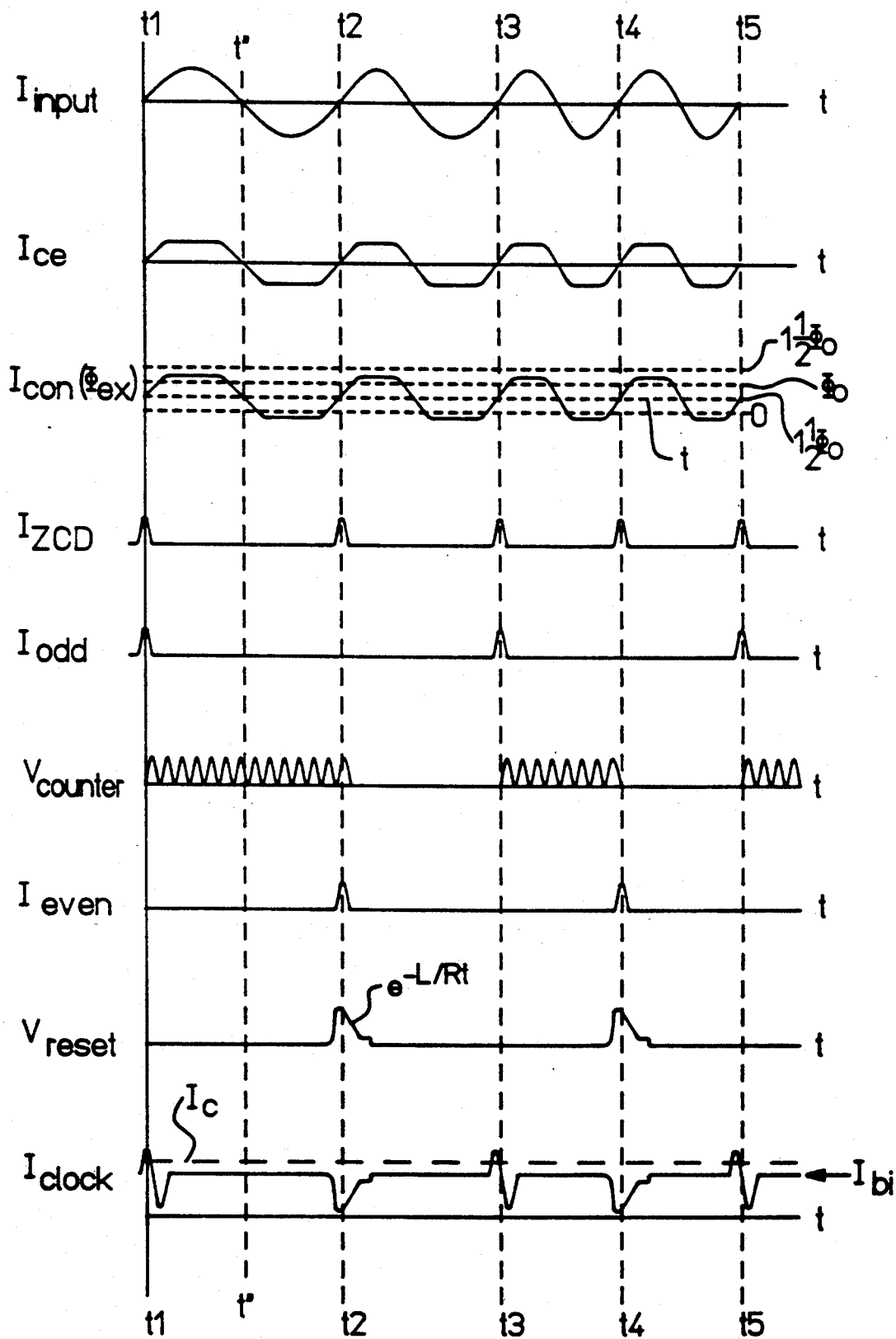
FIG. 10 is a timing diagram, comprising plots of currents and voltages in various portions of the circuit of FIG. 1 as functions of time.

FIG. 1 is a schematic circuit diagram of a system for measuring the frequency of an input signal to illustrate the various aspects of the preferred embodiment of the invention. As shown in FIGS. 1 and 10, an input signal of the waveform illustrated in FIG. 10 is applied to the input node 22 of system 20. Zero-crossing detector 24 detects the zero crossings of the input signal and provides current pulses $I_{ZCD}$ on line 26 to a flip-flop circuit 28. In the preferred embodiment, the current pulse $I_{ZCD}$ indicates the zero crossings of the rising portions of the input signal $I_{input}$. As will be described below, the output of the zero crossing detector 24 may indicate crossings other than the rising portions where such output may be used to measure the frequency of the input signal; these modifications are within the scope of the invention.

The output $I_{ZCD}$ of detector 24 is therefore a sequence of pulses as shown in FIG. 10. When these input pulses are arranged in a time sequence, they consist of odd and even numbered pulses. Thus the pulses of $I_{ZCD}$ occurring at times t1, t3 and t5 form odd numbered pulses $I_{ODD}$ and the pulses occurring at times t2 and t4 form even numbered pulses $I_{EVEN}$. The odd numbered pulses on line 30 are sent to a clock circuit 32. The even numbered pulses on line 34 are sent to a reset circuit 36. Each odd numbered pulse on line 30 would cause the clock circuit 32 to provide clock pulses to a counter 40 whereas each even numbered pulse would cause the reset circuit 36 to stop the clock 32. Hence at time t1, the first odd numbered pulse is provided on line 30 to the clock 32, thereby causing the clock to provide clock pulses to counter 40. At time t2, the immediately following even numbered pulse is sent on line 34 to the reset circuit 36 which causes the clock to stop. Counter 40 therefore counts the number of clock pulses occurring between times t1 and t2. As will be described below, this time interval is approximately one whole period of the input signal $I_{input}$. The count in counter 40 therefore measures the frequency of the input signal.

The schematic circuit of the zero crossing detector 24 will now be described. Circuit 24 includes an interferometer 100 comprising two Josephson junctions 102, 104. The two junctions are connected in parallel forming a loop with one side of both junctions connected to ground and the other side to a current source (not shown) for supplying a bias current to node 101 as shown in FIG. 1. Each of the junctions in the interferometer is shunted by a resistor 106 of low resistance so that each of the junctions is heavily damped. The interferometer is therefore a single quantum flux device. The input signal is coupled to the interferometer magnetically through an inductor 112.

In the preferred embodiment, zero crossing detector 24 includes a clipper or limiter circuit 120 for increasing the dynamic range of the detector. As shown in FIG. 10, the output $I_{cl}$ of the clipper circuit on line 121 is substantially the same as the input signal $I_{input}$ except that the amplitude of the output $I_{cl}$ is not allowed to exceed a certain set value. In such manner, the clipper circuit reduces the amplitude of the input signal while retaining substantially all the information from the input signal on zero crossings. By using the clipper circuit, detector 24 may be used to detect input currents within the range of 30 microamperes to 9.5 milliamperes.

As shown in FIG. 1, the clipper circuit 120 includes a Josephson junction 122 in the shunt path shunting the input signal to ground. Junction 122 behaves essentially like a diode for shunting all excess current above a certain limit to ground. The critical current of junction 122 is suppressed (as indicated by the arrow and the label "$I_s$" in FIG. 1) so that the junction will behave like a diode. Critical current suppression and the behavior of the clipper circuit are explained in detail by Petersen et al. in the article, "A Josephson Analog Limiter Circuit," *IEEE Transactions on Magnetics*, Vol. 25, No. 2, March 1989, pp. 818-821. The notation of the arrow and label "$I_s$" are taken from FIG. 10 of the article. The Petersen article describes the use of such clipper circuits in the context of comparators and A/D converters.

Figure 5:
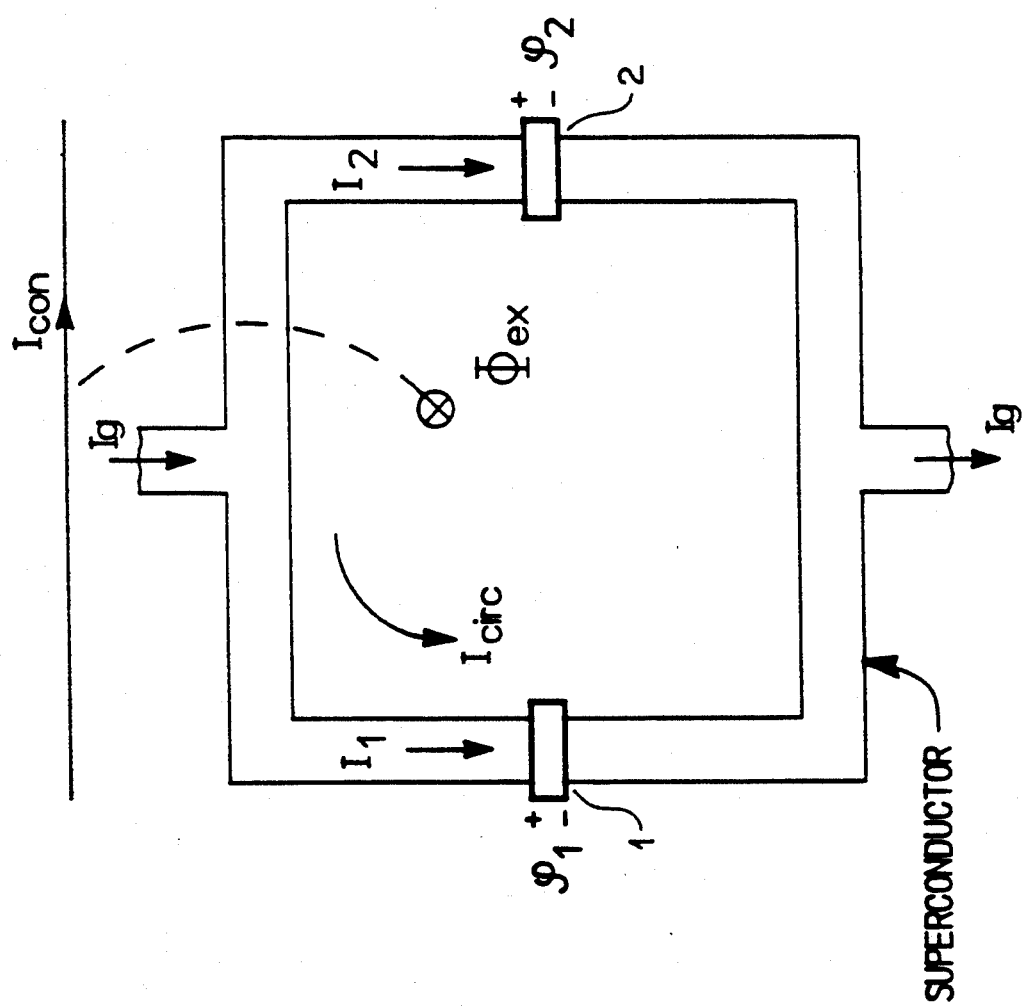
FIG. 5 is a schematic diagram of a two-junction interferometer (dc-SQUID) that is magnetically controlled.
Figure 6A:
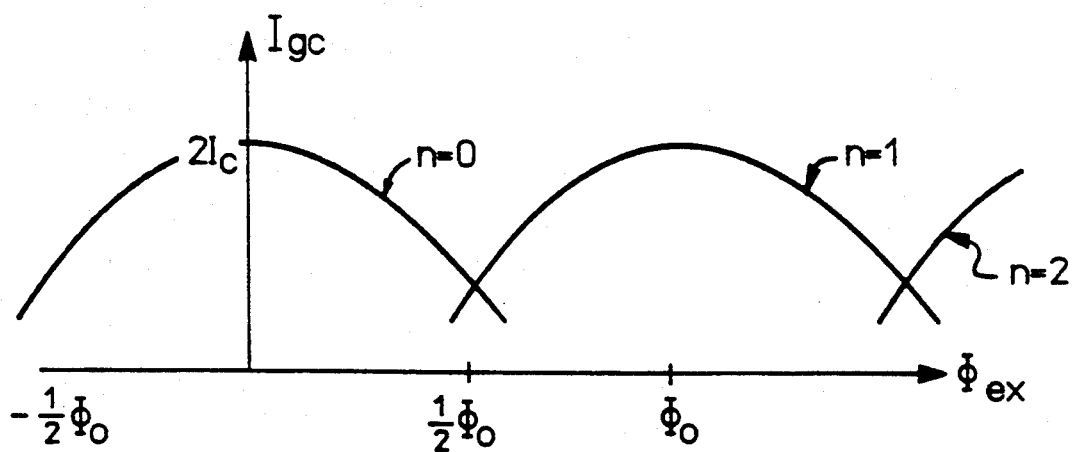
FIG. 6 is a series of three graphs of the maximum superconducting current in each of the arms of the interferometer of FIG. 5, and the maximum total gate current, for the junction to remain in the S-state, plotted as functions of the externally generated magnetic flux through the interferometer loop, showing the different branches corresponding to 0, 1 and 2 flux quanta trapped by the loop.
Figure 6B:
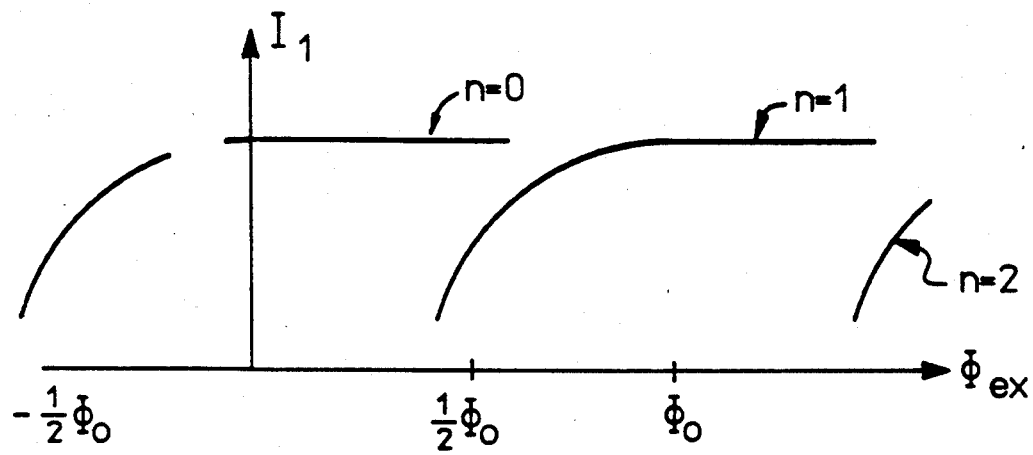
Figure 6C:
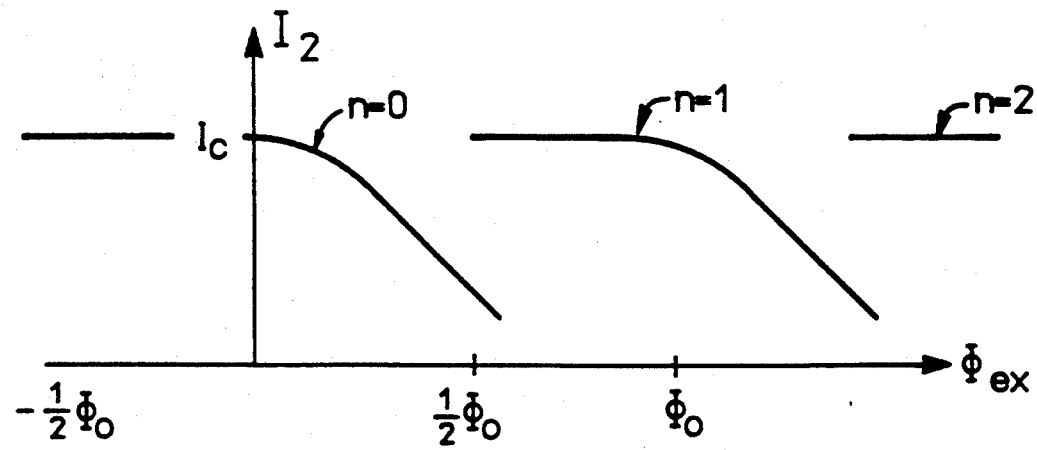
Figure 7:
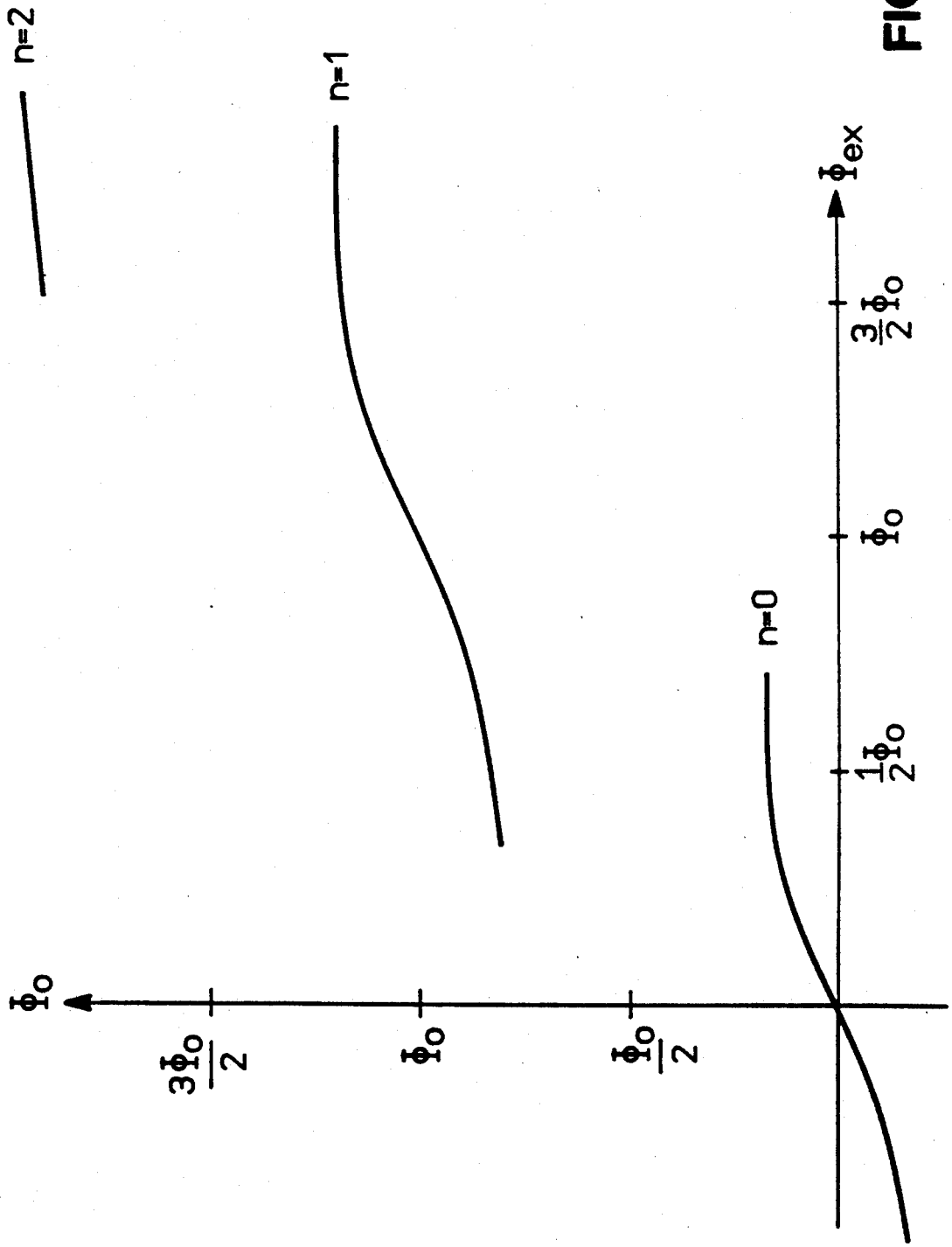
FIG. 7 is a graph of the total magnetic flux versus the externally generated magnetic flux in the interferometer loop of FIG. 5.
Figure 8:
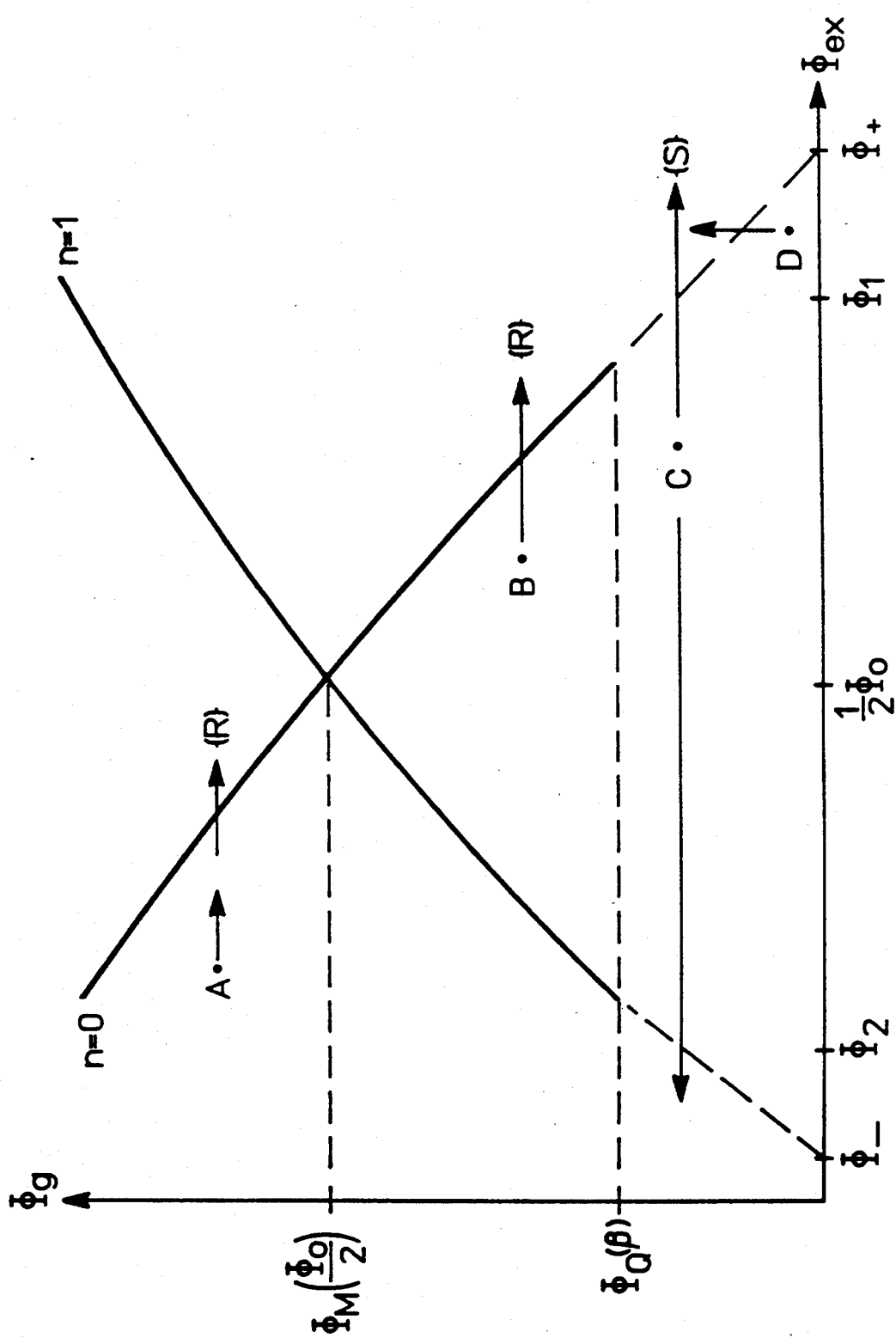
FIG. 8 is an enlarged portion of the graph of FIG. 6 of the maximum gate current versus the externally generated magnetic flux, showing also the gate current-$\Phi_{ex}$ paths for switching between the 0 and single flux quantum states.

As described above in reference to FIGS. 5-8, two junction interferometers may be driven magnetically. A dc current from a current source is added at node 124 to the output of the clipper circuit 120 and a total control current $I_{con}$ is applied to inductor 112 which is connected to ground. The control current through inductor 112 creates a magnetic flux which is applied to the loop of interferometer 100. The amount of dc current added by the dc source is such as to add a half quantum flux ($\frac{1}{2} \Phi_0$) bias. Thus when there is no input signal applied to node 22, the dc bias causes a half quantum flux to be applied to the interferometer, causing a supercurrent to flow through junctions 102, 104 in opposition to such externally applied flux. Such supercurrent is indicated by the counterclockwise arrow between the two junctions in FIG. 1. The bias current $I_g$ applied at node 101 to the junctions 102, 104 and the amount of damping of the two junctions (depending upon the value of the resistance of resistors 106) are such that the supercurrent flowing in junctions 102, 104 is below the value $I_Q$ ($\beta$) in FIG. 8. As indicated in the graph for control current $I_{con}$ in FIG. 10, when the input current $I_{input}$ is 0, the amount of control current from the dc source is such as to apply a half quantum flux to the interferometer. As shown in FIG. 10, when the input signal rises at time t1, the control current increases to apply a greater magnetic flux to the interferometer. When the control current increases to a certain value (labeled $\Phi_1$ in FIG. 8), this means that supercurrent flowing in one of the two junctions 102, 104 tends to reach and exceed the critical current of the junction. This causes a sudden change in phase of $2\pi$ across the junction which in turn causes a voltage pulse to be generated at nodes 132, 134 in accordance with equation (4) above. Employing the same current notation as in FIG. 5, the current $I_1$ through junction 102 is greater than the current $I_2$ through junction 104, thereby resulting in a net circulating current in a counterclockwise direction. The sum of the two currents $I_1$ and $I_2$ is equal to the bias current $I_g$. Therefore, when the control current increases to a certain point as described above, the current $I_1$ through junction 102 approaches and tends to exceed the critical current for the junction. This causes a sudden change in phase of $2\pi$ across junction 102 and a consequent large voltage pulse at node 132. The current $I_1$ drops suddenly to a low value. In such operation, a single quantum flux enters the interferometer and the interferometer is driven from the n=0 state to n=1 state. When the control current is increased as described above, $I_1$ increases, but the current $I_2$ through junction 104 decreases. When the phase across junction 102 changes suddenly, junction 104 also changes simultaneously in phase, causing current $I_2$ to suddenly increase. Such a change in phase across junction 104 also causes a voltage pulse to be generated at node 134.

During the first part of the above-described operation, the voltage pulse generated at node 132 is at least an order of magnitude greater than the voltage pulse generated at node 134. The voltage pulse generated at node 132 appears as the current $I_{ZCD}$ on line 26. Such current is applied to flip-flop 28. Node 134 is connected to ground through a resistor.

During the time period from t1 to t'', when the control current decreases, the current $I_2$ in junction 104 starts to increase and the current $I_1$ through junction 102 starts to decrease. At a certain value of the control current and therefore of the flux applied to the interferometer ($\Phi_1$) in FIG. 8, the current $I_2$ approaches and tends to exceed the critical current for the junction 104 while the current $I_1$ continues to fall. At such juncture, there is again a sudden change in phase of $2\pi$ across junction 104, causing a large voltage pulse to be generated at node 134. Simultaneously, there is a corresponding smaller change in phase across junction 102, causing a small voltage pulse to be generated at node 132. In such operation, a single quantum flux leaves the interferometer and the interferometer is driven from the n=1 state to n=0 state. During such operation, the voltage pulse generated at node 132 is at least an order of magnitude smaller than that at node 134. In other words, the voltage pulse generated by the junction at which current approaches the critical current is much larger than the voltage pulse generated by the other junction in the interferometer. Hence the threshold of the circuitry may be set so that such small voltage pulse falls below the threshold and may simply be ignored. In other words, voltage pulses are generated at node 132 to indicate zero crossings at the rising portion of the input signal while voltage pulses at node 134 are generated to indicate the zero crossings at the falling portion of the input signal.

As shown in FIG. 10, the input signal may have a different slope at its rising portion compared to its falling portion. For this reason, it is desirable to measure the time intervals between zero crossings at rising portions instead of a time interval between the zero crossing at the rising portion and a zero crossing at the falling portion. For this reason, the voltage pulse generated at only one of the two nodes 132, 134 is used. While in FIG. 1, the zero crossings at the rising portions of the input signal are used for measurement, it will be understood that the zero crossings at the falling portion indicated by the voltage pulses at node 132 may be used instead and is within the scope of the invention.

Figure 2:
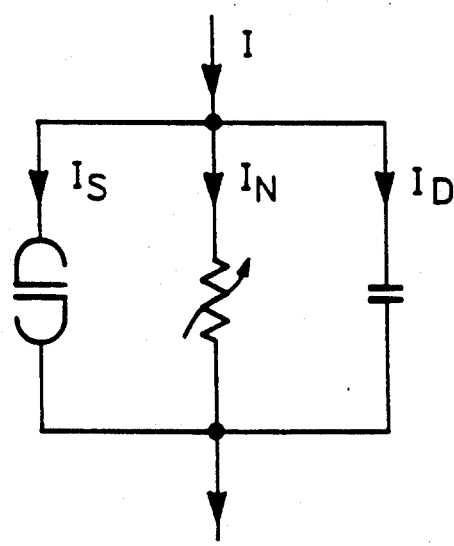
FIG. 2 is a diagram for an equivalent circuit of a Josephson junction according to the RSJ model. An ideal junction is indicated by the "double-J" circuit symbol. The curved arrow through the resistance denotes nonlinear conductance.
Figure 3:
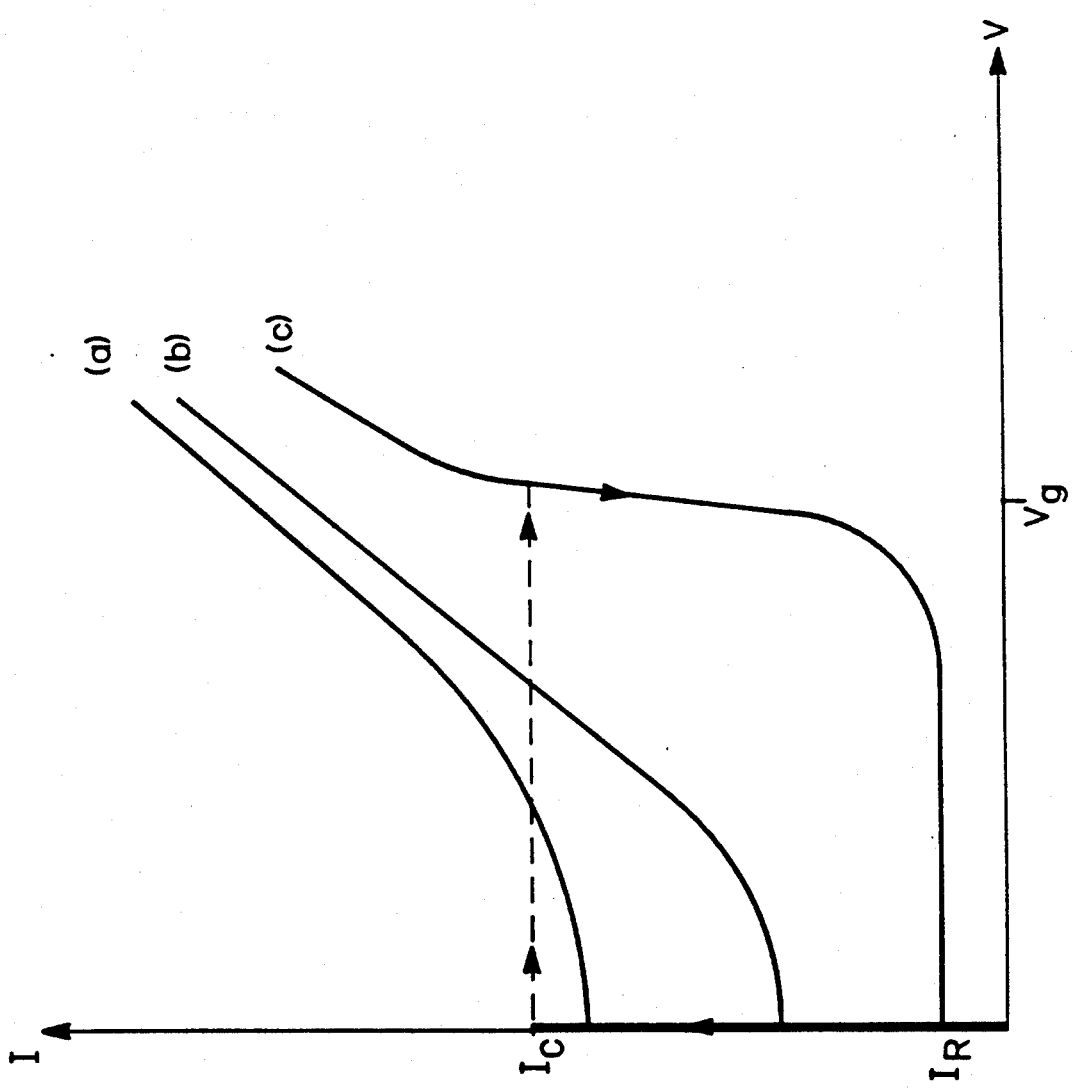
FIG. 3 is a schematic plot of Josephson junction current versus average voltage for the case of (a) large damping, (b) small damping according to the RSJ model, and (c) low damping in a realistic model taking account of the conductance nonlinearity.
Figure 4A:
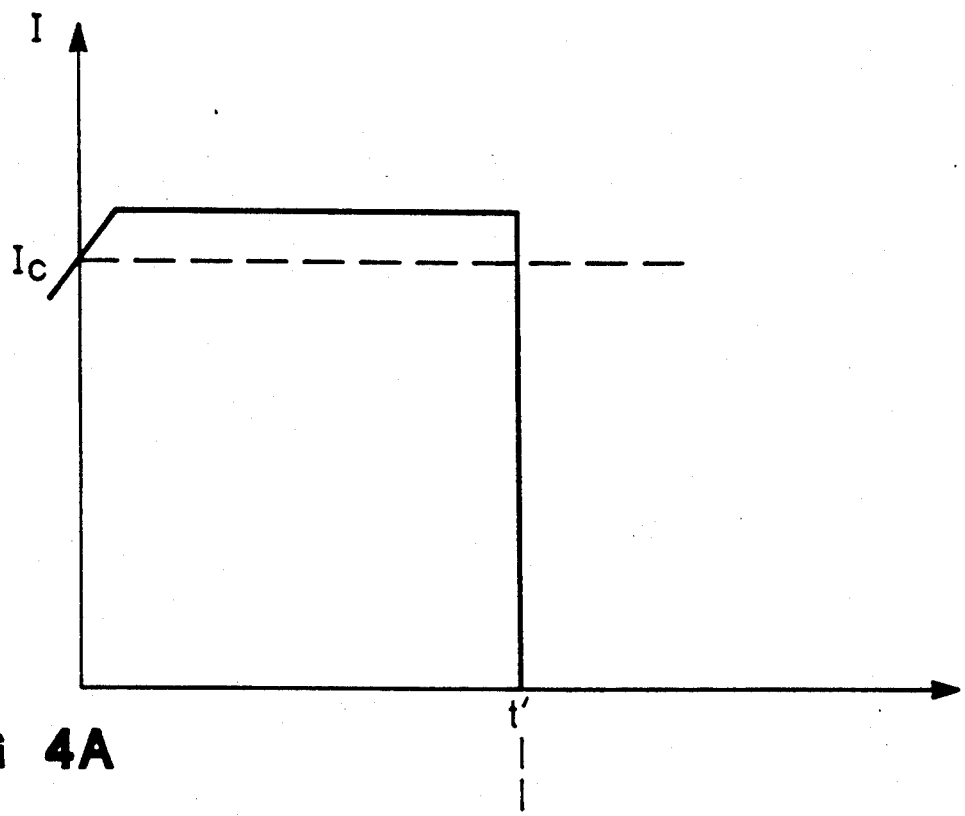
FIG. 4 is a pair of graphs showing the time-dependent response of a Josephson junction with low damping to a current pulse. The upper graph is the current as a function of time and the lower graph shows the resulting voltage across the junction plotted against time.
Figure 4B:
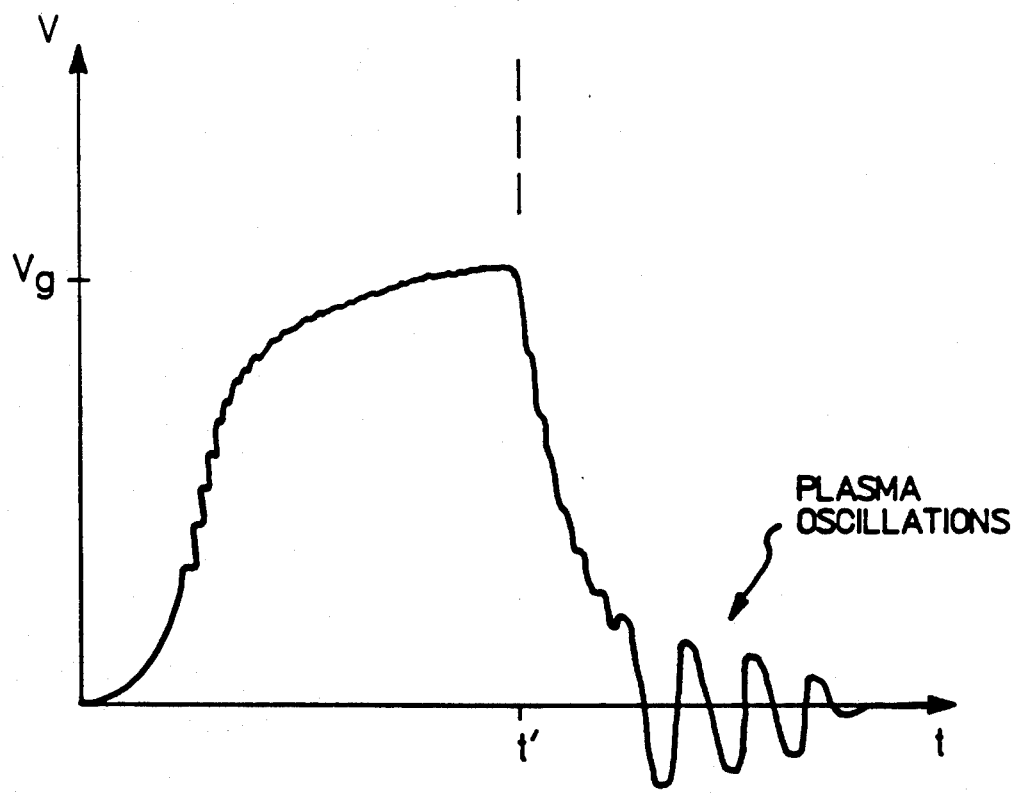

The current pulse $I_{ZCD}$ is applied to the flip-flop 28. The flip-flop circuit 28 is the same as the number one or number two bit scalers described by Hurrell et al. in "Analog-to-Digital Conversion with Unlatched SQUID's," *IEEE Transactions on Electron Devices*, Vol. ED-27, No. 10, October 1980, pp. 1887–1896 at 1889. See especially FIG. 2 in such article. The flip-flop circuit 28 acts simply as a toggle switch, passing odd numbered pulses $I_{odd}$ to line 30 and even pulses $I_{even}$ to line 34.

From the above description, it will be obvious that the flip-flop circuit 28 is not essential to system 20 of FIG. 1. Thus in an alternative embodiment, the pulses $I_{ZCD}$ from node 132 may be applied to the clock circuit 32 and the voltage pulses from node 134 applied to the reset circuit 36. In such alternative embodiment, the current pulse $I_{ZCD}$ still starts the clock 32, thereby causing it to provide pulses to counter 40. However, instead of stopping the clock at the zero crossing at the next rising portion of the input signal, the reset circuit 36 in the alternative embodiment stops the clock at the zero crossing at the next occurring falling portion. In other words, if the voltage pulse at node 132 causes the clock circuit 32 to stop providing pulses at time t1, the reset circuit 36 will cause the clock circuit to stop providing pulses at time t''. Thus the number of clock pulses counted by counter 40 indicates the time interval between times t1 and t'', which is half of the period of the input signal. As described above, the frequency measurement performed by the alternative embodiment is possibly subject to greater errors since the falling portion of the input signal may have different characteristics compared to the rising portion.

The clock circuit 32 will now be described. A dc bias is applied at node 150. This causes a bias current at a value slightly below the critical current of junction 152 to be applied to the junction on line 154. At time t1, the sudden change in phase across junction 102 causes a current pulse $I_{odd}$ to be added to the bias current applied to node 150. This causes the current $I_{clock}$ applied to junction 152 to exceed its critical current as shown in FIG. 10. Junction 152 changes from the S-state to the R-state (in about a picosecond) whereupon the voltage at node 156 causes a voltage pulse through resistor 158 and transmission line 160. After the passing of the pulse $I_{odd}$ after time t1, the voltage at node 156 is given by the product of the bias current ($I_{bias}$) times the effective impedance of transmission line 160 together with resistor 158 and other low impedance elements. If such voltage is less than the plasma voltage of the junction, junction 152 resets (also in about a picosecond). In other words, in order for junction 152 to reset, the total impedance of transmission line 160 together with resistor 158 should be less than the ratio of the plasma voltage of the junction 152 to the biasing current $I_{bias}$ applied to node 150. As to an explanation of the plasma voltage of a Josephson junction, please see "The AC Josephson Effect," *Dynamics of Josephson Junctions and Circuits*, by Konstantin K. Likharev, Gordon and Breach Science Publishers, Chapter 4, pp. 96-99.

The above-described voltage spike generated is then "launched" into resistor 158 and transmission line 160 which together form a resonator. At the end of the line at node 162, the pulse sees an effective "infinite" resistance and hence, is fully reflected back to node 156. Transmission line 160 introduces a delay so that when the pulse returns to node 156 after reflection, junction 152 has already been reset so that the junction again returns to the S-state biased by the bias current $I_{bias}$ applied to node 150 where the bias current is only slightly below the critical current of the junction. Hence the return of the pulse to node 156 again triggers the switching of the junction so that another voltage pulse is generated at node 156 and launched into the resonator comprising resistor 158 and transmission line 160.

The above-described process of clock pulse generation is therefore self-perpetuating and a sequence of voltage pulses $V_{counter}$ is generated at node 156 and applied to counter 40. Transmission line 160 may be made of a normal metal material or a superconducting material. Preferably it is made of a superconducting material so that little energy is dissipated by the clock circuit 32. Hence unless the clock circuit 32 is stopped by an external mechanism, potentially it can provide clock pulses for a long time. Therefore, a stopping mechanism is required to stop the clock. The resistance of the resistor 158 is substantially the same as the impedance of the transmission line 160 to prevent "ringing" of the transmission line, which is where some fraction of the pulse energy would continue to bounce back and forth in the resonating transmission line.

The reset circuit 36 for stopping the clock will now be described. When an $I_{even}$ pulse appears on line 34 (at times t2, t4), this pulse is coupled to an interferometer 172 through inductor 174. Interferometer 172 includes at least two Josephson junctions 176, 178. The biasing current $I_{bias}$ applied to node 150 will be split equally between junctions 176, 178, assuming that the two junctions are essentially the same. The two junctions are such that the critical current is slightly above the biasing current through each junction which is one-half of $I_{bias}$. Therefore, when a current pulse $I_{even}$ is coupled magnetically to the interferometer 172, both junctions 176, 178 will switch from the S-state to the R-state and the voltage $V_{reset}$ will appear at node 150. When the two junctions are in the R-state, interferometer 172 is of high impedance so that the current $I_{clock}$ falls. The above operation is illustrated in FIG. 10.

The voltage $V_{reset}$ drives a current through inductor 182 and resistor 184. Before the voltage $V_{reset}$ decays, however, the two junctions in interferometer 172 remain in the high impedance R-state to block the current from node, 150 to the clock circuit 32. When this happens, the condition for switching of junction 152 of clock circuit is curtailed. Since current through the junction is much below its critical current, reflection of the pulse from node 162 back to node 156 will no longer cause junction 152 to switch to provide the next voltage pulse. In this manner, the reset circuit 36 stops the clock circuit 32 in response to the current pulse $I_{even}$. The voltage pulses shown as $V_{counter}$ therefore stop at times t2 and t4.

In reference to the reset circuit in FIG. 1, the voltage $V_{reset}$ will decay over time in accordance with a time constant L/R where L is the inductance of inductor 182 and R is the resistance of resistor 184. When such voltage decays to a value less than the plasma voltage of junctions 176, 178, the two junctions will switch back to the S-state and permit the current $I_{bias}$ to flow from node 150 to junction 152 in the clock circuit. Junction 152 is then again biased close to its critical current so that its clock circuit is ready to provide clock pulses when triggered by the signal $I_{odd}$ as before, such as at times t3 and t5. It should be noted that the timing diagrams in FIG. 10 are not drawn to scale so that the duration of the voltage $V_{reset}$ is very short compared to the period of the input signal so that the "down time" of the clock circuit is negligible compared to the period of the input signal for which the clock is designed to measure. Counter 40 may be similar in design to the counter in FIG. 2 of Hurrell et al. referenced above.

Figure 9:
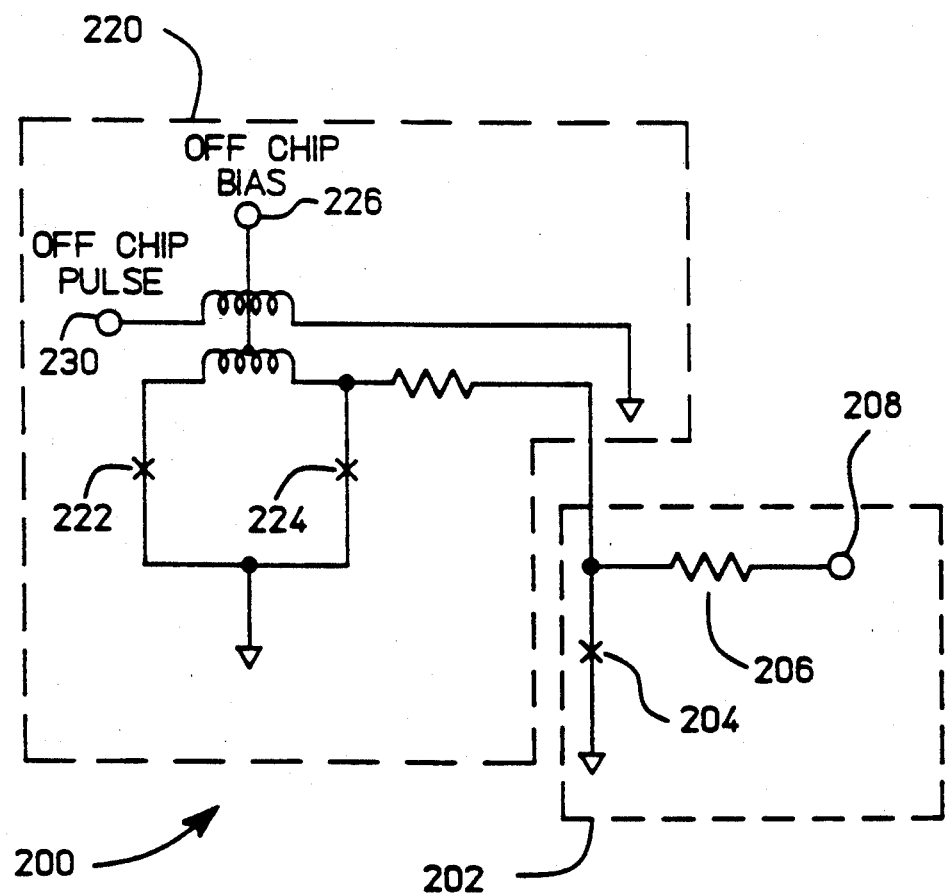
FIG. 9 is a schematic circuit diagram of a rejuvenator and arming circuit for use with the system of FIG. 1 to illustrate the preferred embodiment of the invention.

Even when the transmission line 160 is made of a superconducting material, energy dissipation is still inevitable so that the clock pulses provided by circuit 32 may dissipate. To rejuvenate the clock pulse, a pulse rejuvenator and an arming circuit shown in FIG. 9 may be employed. The pulse rejuvenator circuit 202 includes a Josephson junction 204 and a resistor 206. Thus if junction 204 is biased by current close to but under its critical current, and node 208 is connected to node 162, the clock pulse generated by junction 152 and transmitted through transmission line 160 will reach junction 204. Such pulses will cause junction 204 to switch briefly from the S-state to the R-state which generates a voltage pulse; such pulse is transmitted back through transmission line 160 to junction 152. In other words, instead of being a strict reflection at node 162, now a pulse is positively generated by junction 204 and transmitted back to junction 162 through the transmission line to rejuvenate the clock pulse and to prevent the pulse from being dissipated. Preferably resistor 206 has the same resistance as resistor 158. The biasing of junction 204 is controlled by an arming circuit 220 which may simply be a latched gate employing two Josephson junctions; such a latched gate is known to those skilled in the art. The arming circuit 220 is similar in many ways to the reset circuit 36. Junctions 222 and 224 are biased by current applied to node 226 near their critical current. If a pulse is applied to node 230, triggering the switching of the two junctions 222, 224 to the R-state, a voltage across the two junctions 222, 224 would develop, thereby causing a bias current to flow to junction 204 in order to bias junction 204 near its critical current. In order to turn off the rejuvenator circuit 202, the current applied to node 226 is turned off so that junction 204 is no longer biased near its critical current. The voltage at node 226 would decrease to a value below the plasma voltages of junctions 222, 224 so that these two junctions will reset to the S-state. In order to arm the rejuvenator circuit 202 again, a bias current is again applied to node 226 and a pulse is then applied to node 230.

As a further improvement, it is possible to phase lock the clock circuit 32 of FIG. 1 to a clean signal source. The clock circuit 32 may develop noise for various reasons, such as low frequency phase noise. In order to reduce such noise, the signal at node 162 may be first converted by a counter into an analog signal and mixed with a clean sine wave generated by a clean signal source. The low frequency or dc component of the mixer output is then fed back to node 192 to phase lock the clock circuit 32 to the clean signal source. Thus if clock circuit 32 is slightly faster than it should be, the signal fed back to node 192 will cause the biasing current $I_{bias}$ to slightly decrease but not to the extent as to prevent the triggering of junction 152. A slight decrease in the magnitude of the biasing current may have the effect of causing junction 152 to be triggered at a slightly later time than it would otherwise have without the feedback loop. In this instance, therefore, the effect of the feedback is to reduce the frequency of the clock signals from circuit 32 slightly. As described above, clock circuit 32 operates at a high frequency, such as 80 GHz. Therefore, it may be necessary to employ a frequency divider between node 162 and the counter. A low pass filter may be employed between the mixer and node 192 in order to filter out the high frequency components of the mixer output.

While the invention has been described above by reference to the preferred embodiment illustrated in the figures, it will be understood that various modifications may be made. Hence the signal $I_{even}$ may be coupled to the interferometer 172 directly as a current pulse through the two junctions instead of magnetically through inductor 174. In some circumstances, such direct current injection may be undesirable since the two junctions 176, 178 are not heavily damped. Thus such direct current injection may cause noise or even current feedback to the zero crossing detector circuit and cause spurious clock pulses from clock circuit 32. The reset circuit 36 may include only one junction instead of two; however, it may be difficult to magnetically couple the current pulse $I_{even}$ to a single junction. Interferometer 172 may include three or more junctions connected in parallel. Such and other modifications may be made without departing from the scope of the invention which is to be limited only by the appended claims.

What is claimed is:

1. A clock comprising:
    a Josephson junction with a plasma voltage and a critical current;
    means for applying a triggering pulse to the junction;
    means for applying a biasing current to the junction, said biasing current being below the critical current of the junction, and for damping the junction so that reset voltage of the junction is less than its plasma voltage; and
    a resonant circuit connected to the junction at an output node, so that the junction causes a voltage pulse to be propagated through the circuit in response to the triggering pulse, said junction being automatically reset thereafter; said circuit including a transmission line and providing a return voltage pulse to the junction after a predetermined delay in response to a voltage pulse from the junction so that, after being reset, the junction is again triggered by the return voltage pulse to cause another voltage pulse to be propagated through the circuit in response to the return voltage pulse, said clock thereby generating clock pulses at the output node in response to said triggering pulse applied to the junction.

2. The clock of claim 1, said clock having a fundamental period, said resonant circuit comprising a first resistor in series with said transmission line, wherein the fundamental period of the clock is determined by the length and phase velocity of the transmission line.

3. The clock of claim 2, wherein the transmission line has an impedance substantially equal to that of the first resistor.

4. The clock of claim 2, wherein said transmission line includes a normal metal material or a superconducting material.

5. The clock of claim 2, said transmission line having two ends, wherein said transmission line is connected to the resistor at one end and is substantially open circuit at the other.

6. The clock of claim 2, said transmission line having two ends, wherein said transmission line is connected to the resistor at one end, said clock further comprising a second Josephson junction and a second resistor shunting the other end of the transmission line for rejuvenating clock pulses generated by the clock.

7. The clock of claim 6, wherein the resistance of said second resistor is substantially equal to that of the first resistor.

8. The clock of claim 6, further comprising means for biasing the second Josephson junction.

9. The clock of claim 8, said biasing means including a latching gate, said latching gate including an interferometer comprising at least two Josephson junctions connected in parallel.

10. The clock of claim 1, further comprising means for blocking the biasing current for stopping the generation of clock pulses.

* * * * *